(12) United States Patent
Willis et al.

(10) Patent No.: US 7,868,426 B2
(45) Date of Patent: Jan. 11, 2011

(54) METHOD OF FABRICATING MONOLITHIC NANOSCALE PROBES

(75) Inventors: Brian G. Willis, Wilmington, DE (US); Rahul Gupta, Newark, DE (US)

(73) Assignee: University of Delaware, Newark, DE (US)

( * ) Notice: Subject to any disclaimer, the term of this patent is extended or adjusted under 35 U.S.C. 154(b) by 277 days.

(21) Appl. No.: 12/180,848

(22) Filed: Jul. 28, 2008

(65) Prior Publication Data

US 2009/0085556 A1 Apr. 2, 2009

Related U.S. Application Data

(60) Provisional application No. 60/952,090, filed on Jul. 26, 2007.

(51) Int. Cl.
| | |
|---|---|
| H01L 29/06 | (2006.01) |
| H01L 29/76 | (2006.01) |
| H01L 29/94 | (2006.01) |
| H01L 31/062 | (2006.01) |
| H01L 31/113 | (2006.01) |
| H01L 31/119 | (2006.01) |

(52) U.S. Cl. .................. 257/618; 257/343; 257/377; 257/382; 257/E29.07; 977/707; 977/762

(58) Field of Classification Search ............... 257/343, 257/377, 382, 618, E29.07; 977/707, 762
See application file for complete search history.

(56) References Cited

U.S. PATENT DOCUMENTS

| | | | | |
|---|---|---|---|---|
| 7,084,507 | B2 * | 8/2006 | Awano | 257/773 |
| 7,420,199 | B2 * | 9/2008 | Gutsche et al. | 257/2 |
| 7,446,025 | B2 * | 11/2008 | Cohen et al. | 438/583 |
| 7,569,846 | B2 * | 8/2009 | Choi et al. | 257/4 |
| 7,741,664 | B2 * | 6/2010 | Choi et al. | 257/291 |
| 7,776,759 | B2 * | 8/2010 | Lahnor et al. | 438/758 |
| 2008/0149944 | A1 * | 6/2008 | Samuelson et al. | 257/88 |

(Continued)

OTHER PUBLICATIONS

Guillorn, M. A., et al., "Fabrication of Dissimilar Metal Electrodes with Nanometer Interelectrode Distance for Molecular Electronic Device Characterization," *J. Vac Sci Technol. B*, 18:3, May/Jun. 2000, pp. 1177-1181.

(Continued)

*Primary Examiner*—Ida M Soward
(74) *Attorney, Agent, or Firm*—RatnerPrestia

(57) ABSTRACT

A monolithic pair of nanoscale probes, including: a substrate having a cavity that extends from a surface of the substrate into its body; a dielectric layer formed on the substrate; a pair of nanoscale probe precursors formed over the dielectric layer; a plurality of sub-monolayers of electrode material selectively atomic layer deposited over the pair of nanoscale probe precursors. The dielectric layer includes a window that extends through it to the cavity of the substrate such that a portion of the dielectric layer adjacent to the window extends over the cavity. The pair of nanoscale probe precursors includes a pair of edges facing each other across the window. These edges correspond to tips of the pair of nanoscale probes. The sub-monolayers of electrode material include the pair of edges, so that a distance between the tips of the nanoscale probes is between about 0.1 nm and about 20 nm.

18 Claims, 6 Drawing Sheets

U.S. PATENT DOCUMENTS

| | | | |
|---|---|---|---|
| 2009/0114903 A1* | 5/2009 | Kalburge | 257/24 |
| 2009/0200536 A1* | 8/2009 | Van Schaijk et al. | 257/4 |
| 2009/0200641 A1* | 8/2009 | Hurkx et al. | 257/565 |
| 2009/0321716 A1* | 12/2009 | Wernersson et al. | 257/24 |
| 2010/0112748 A1* | 5/2010 | Vidu et al. | 438/94 |
| 2010/0193768 A1* | 8/2010 | Habib | 257/9 |

OTHER PUBLICATIONS

Morpurgo, A. F., et al., "Controlled Fabrication of Metallic Electrodes with Atomic Separation," *Applied Physics Letters*, 74:14, Apr. 1999, pp. 2084-2086.

Kervennic, Y. V., et al., "Nanometer-Spaced Electrodes with Calibrated Separation," *Applied Physics Letters*, 80:2, Jan. 2002, pp. 321-323.

Li, C. Z., et al., "Quantized Tunneling Current in the Metallic Nanogaps Formed by Electrodeposition and Etching," *Applied Physics Letters*, 77:24, Dec. 2000, pp. 3995-3997.

Bezryadin, A., et al., "Electrostatic Trapping of Single Conducting Nanoparticles Between Nanoelectrodes," *Applied Physics Letters*, 71:9, Sep. 1997, pp. 1273-1275.

Kashimura, Y., et al., "Fabrication of Nano-Gap Electrodes Using Electroplating Technique," *Thin Sold Films*, 438-439, 2003, pp. 317-321.

Visconti, P., et al., "Fabrication of Sub-10 nm Planar Nanotips for Transport Experiments of Biomolecules," *Materials Science & Engineering C*, vol. 23, 2003, pp. 889-892.

Austin, M., et al., "Fabrication of Nanocontacts for Molecular Devices Using Nanoimprint Lithography," *J. Vac. Sci. Technol. B*, 20:2, Mar./Apr. 2002, pp. 665-667.

Park, H., et al., "Fabrication of Metallic Electrodes with Nanometer Separation by Electromigration," *Applied Physics Letters*, 75:2, Jul. 1999, pp. 301-303.

Nagase, T., et al., "Fabrication of Nano-Gap Electrodes for Measuring Electrical Properties of Organic Molecules Using a Focused Ion Beam," *Thin Solid Films*, 438-439, 2003, pp. 374-377.

He, H. X., et al., "Electrochemical Fabrication of Atomically Thin Metallic Wires and Electrodes Separated with Molecular-Scale Gaps," *Journal of Electroanalytical Chemistry*, vol. 511, 2002, pp. 167-172.

Visconti, P., et al., "The Fabrication of Sub-10 nm Planar Electrodes and Their Use for a Molecule-Based Transistor," *Nanothechnology*, vol. 15, 2004, pp. 807-811.

Kim, J. C., et al., "Fabrication of Contact Electrodes in Si for Nanoelectronic Devices Using Ion Implantation," *Applied Surface Science*, vol. 239, 2005, pp. 335-341.

Kervennic, U. V., et al., "Planar Nanocontacts with Atomically Controlled Separation," *Applied Physics Letters*, 3:18, Nov. 2003, pp. 3782-3784.

Deshmukh, M. M., et al., "Fabrication of Asymmetric Electrode Pairs with Nanometer Separation Made of Two Distinct Metals," *Nano Letters*, 3:10, 2003, pp. 1383-1385.

Cai, L. T., et al., "Nanowire-Based Molecular Monolayer Junctions: Synthesis, Assembly, and Electrical Characterization," *J. Phys. Chem. B.*, vol. 108, 2004, pp. 2827-2832.

Itoua, S. et al., "Fabrication and AFM Characterization of a Co-Planar Tunnel Junction with a Less Than 30 nm Interelectrode Gap," *Nanothechnology*, vol. 5, 1994, pp. 19-25.

Xiao, X. et al., "Measurement of Single Molecule Conductance: Benzenedithiol and Benzenedimethanethiol," *Nano Letters*, 4:2, 2004, pp. 267-271.

Zandbergen, H. W., et al., "Sculpting Nanoelectrodes with a Transmission Electron Beam for Electrical and Geometrical Characterization of Nanoparticles," *Nano Letters*, 5:3, 2005, pp. 549-553.

Van Ruitenbeek, J. M., et al, "Adjustable Nanofabricated Atomic Size Contacts," *Rev. Sci. Instrum.*, 67:1, Jan. 196, pp. 108-111.

Malaquin, L., et al., "Interdigitated Nanoelectrodes for Nanoparticle Detection." *Nanotechnology*, vol. 16, 2005, pp. S240- S245.

Kummel, A. C., "How to Assemble a Molecular Junction," *Science*, vol. 302, Oct. 2003, pp. 69-70.

Miyazaki, T., et al., "Fabrication of a Nanogap on a Metal Nanowire Using Scanning Probe Lithography," *Jpn. J. Appl . Phys.*, vol. 40, 2001, pp. 4365-4367.

Steinmann, P., et al., "Fabrication of Metallic Tunnel Junctions for the Scanning Single Electron Transistor Atomic Force Microscope," *J. Vac. Sci. Technol. B*, 21:5, Sep./Oct. 2003, pp. 2138-2141.

Boussaad, S., et al., "Atom-Size Gaps and Contacts Between Electrodes Fabricated with a Self-Terminated Electrochemical Method." *Applied Physics Letters*, 80:13, Apr. 2002, pp. 2398-2400.

Fischbein, M. D., et al., "Nanogaps by Direct Lithography for High-Resolution Imaging and Electronic Characterization of Nanostructures," *Applied Physics Letters*, vol. 88, 2006, pp. 063116-1-063116-3.

Strachan, D. R., "Controlled Fabrication of Nanogaps in Ambient Environment for Molecular Electronics," *Applied Physics Letters*, vol. 86, 2005, pp. 043109-1-043109-3.

Lindsay, S., "Single-Molecule Electronic Measurements with Metal Electrodes," *Journal of Chemical Education*, 82:5, May 2005, pp. 727-733.

Steinmann, P., et al., "Nanometer-Scale Gaps Between Metallic Electrodes Fabricated Using a Statistical Alighment Technique," *Applied Physics Letters*, vol. 86, 2005, pp. 063104-1-063104-3.

Steinmann, P., et al., "Fabrication of Sub-5 nm Gaps Between Metallic Electrodes Using Conventional Lithographic Techniques," *J. Vac. Sci. Technol. B*, 22:6, Nov./Dec. 2004, pp. 3178-3181.

Philipp, G., et al., "Shadow Evaporation Method for Fabrication of Sub 10 nm Gaps Between Metal Eletrodes," *Microelectronic Engineering*, vol. 46, 1999, pp. 157-160.

Di Fabrizio, E., et al., "Fabrication of 5 nm Resolution Electrodes for Molecular Devices by Means of Electron Beam Lithography," *Jpn. J Appl. Phys.*, vol. 36, 1997, pp. L70-L72.

Huang, L. et al., "Fabrication of a Nano-Scale Gap by Selective Chemical Deposition," *Chem. Commun.*, 2002, pp. 72-73.

\* cited by examiner

METHOD OF FABRICATING MONOLITHIC NANOSCALE PROBES

CROSS REFERENCE TO RELATED APPLICATIONS

This Application claims the priority date of U.S. Provisional Application 60/952,090, filed Jul. 26, 2007, the contents of which are herein incorporated by reference.

STATEMENT REGARDING FEDERALLY SPONSORED RESEARCH OR DEVELOPMENT

The U.S. Government has a paid-up license in the present invention and the right in limited circumstances to require the patent owner to license others on reasonable terms as provided for by contract as awarded by the National Science Foundation under funding number NSF-ECS0608730.

FIELD OF THE INVENTION

The present invention concerns monolithic nanoscale probes and methods of fabricating monolithic nanoscale probes. Such monolithic nanoscale probes may allow for improved analysis of various nanometer scale objects. In particular, these monolithic nanoscale probes may be used to perform single molecule electrical measurements and chemical bonding analyses at a molecular level.

BACKGROUND OF THE INVENTION

Molecular electronics is a rapidly growing area of research that seeks to understand charge transport at the single molecule level. Such knowledge may create active nanostructures that extend computing, electronic memory, bio-chemical sensing, or energy harvesting beyond the limits of modern technologies. Although there are many challenges to the realization of practical molecular devices, the area holds great promise due to the richness of molecular properties and the complexity of inorganic, organic, and biological molecules that can be synthesized. In a broader scientific context, there is a desire to understand and harness the unique properties of matter on an atomic, or molecular, length scale.

According to the 2005 International Technology Roadmap for Semiconductors (ITRS), the gate length of state of the art transistors is expected to reach below 20 nm by 2015. These small dimensions are expected to create practical, as well as technical, limitations. For example, fabrication facility costs are projected to be $102 billion by 2015 (M. LaPedus, "Soaring Tool Costs to Delay 450 mm Fabs," EE Times, Aug. 19, 2005). Moreover, management of the heat generated by multi-billion transistor chips is a major challenge. Thus, there is great interest in new concepts for future computing technologies. One of the areas of exploration is molecular electronics. Due to the vast possibilities of molecular synthesis and the atomic precision of molecule design, there is an interest in understanding the electrical properties of molecules for future nanoelectronic devices. Molecular devices may function as wires, switches, transistors, or sensors, for example.

The potential impacts of molecular electronics have ignited much interest in the measurement of electrical conduction through single molecules. The growing body of data has demonstrated the importance of chemical structure, electrode bonding chemistry, and electrode material on the observed molecular conductance. However, the understanding of electrode atomic structure and molecule-electrode bonding geometry in metal-molecule-metal tunnel junctions is lacking, and existing experimental techniques are not readily extended to address this problem. There is a need for new approaches to the study of electrode atomic structure, and the effects of structure on chemical bonding and charge transport at molecule-electrode interfaces. The present invention addresses these needs among others.

SUMMARY OF THE INVENTION

An exemplary embodiment of the present invention is a method for fabricating a monolithic pair of nanoscale probes. A layer of a dielectric material is formed on a surface of a substrate formed of a material that is different from the dielectric material. The dielectric layer is formed such that it includes a window through the dielectric layer that exposes a section of the surface of the substrate. The exposed section of the substrate is etched though the window using an isotropic etching technique that selectively etches the substrate material and substantially does not etch the dielectric material. Thus, the substrate is etched to form a cavity that is shaped such that a portion of the dielectric layer adjacent to the window is undercut. A nucleation layer is substantially anisotropically deposited over the dielectric layer. The nucleation layer is patterned to form a pair of nanoscale probe precursors. This pair of nanoscale probe precursors includes a pair of edges facing each other across a gap that corresponds to tips of the monolithic pair of nanoscale probes. Atomic layer deposition is used to selectively deposit a sub-monolayer of electrode material over the pair of nanoscale probe precursors including the pair of edges. The sub-monolayer layer of electrode material narrows the distance between the tips of the pair of nanoscale probes. Atomic layer deposition is repeated until the distance between the tips of the pair of nanoscale probes is narrowed to approximately a predetermined probe width.

Another exemplary embodiment of the present invention is a monolithic pair of nanoscale probes, including: a substrate having a cavity that extends from a surface of the substrate into a body of the substrate; a dielectric layer formed on the surface of the substrate; a pair of nanoscale probe precursors formed over the dielectric layer; a plurality of sub-monolayers of electrode material selectively atomic layer deposited over the pair of nanoscale probe precursors. The dielectric layer includes a window that extends through the dielectric layer to the cavity of the substrate such that a portion of the dielectric layer adjacent to the window extends over the cavity. The pair of nanoscale probe precursors includes a pair of edges facing each other across the window. The pair of edges of the pair of nanoscale probe precursors correspond to tips of the pair of nanoscale probes. The sub-monolayers of electrode material include the pair of edges, so that a distance between the tips of the pair of nanoscale probes is approximately equal to a predetermined probe width between about 0.1 nm and about 20 nm.

Another exemplary embodiment of the present invention is a monolithic pair of nanoscale probes, including: first and second materials, the second material being formed on the surface of the first material and having a cavity extending through the second material into the first material and undercutting the second material; a pair of nanoscale projections formed from the second layer and having surfaces facing to each other; and a pair of nanoscale electrodes. The pair of nanoscale electrodes is formed by a plurality of sub-monolayers of electrode material. The plurality of sub-monolayers is formed over the pair of nanoscale projections such that a distance between facing surfaces of the pair of nanoscale electrodes is approximately equal to a predetermined probe separation between about 0.1 nm and about 20 nm and the nanoscale probes are one of: electrically isolated from each other or electrically coupled by a tunneling current.

Another exemplary embodiment of the present invention is a monolithic pair of nanoscale probes formed by selective atomic layer deposition over a pair of nanoscale probe projections corresponding to tips of the monolithic pair of nanoscale probes so that a distance between the tips of the pair of nanoscale probes is approximately equal to a predetermined probe separation between about 0.1 nm and about 20 nm, wherein the nanoscale probes are one of: electrically isolated from each other or electrically coupled by a tunneling current.

BRIEF DESCRIPTION OF THE DRAWINGS

The invention is best understood from the following detailed description when read in connection with the accompanying drawings. It is emphasized that, according to common practice, the various features of the drawings are not to scale. On the contrary, the dimensions of the various features are arbitrarily expanded or reduced for clarity. Included in the drawing are the following figures.

DETAILED DESCRIPTION OF THE INVENTION

The exemplary embodiments of the present invention use atomic layer deposition and engineering principles to control the nanoelectrode microstructure and electrical properties for molecular tunnel junction measurements. Experiments have been carried out in an ultra-high vacuum multi-chamber reactor that allows in-situ measurements of the metal-vacuum-metal and metal-molecule-metal tunnel junctions without contamination of the electrode surfaces. These exemplary experiments demonstrate the potential of exemplary embodiments of the present invention to provide detailed understanding of electrode structure effects in molecular tunnel junctions.

The engineering of molecular devices utilizes an understanding of charge transport through molecules at electrode-molecule junctions. Previous experimental and theoretical studies have contributed much towards the understanding of molecular devices; however, a rudimentary knowledge of how molecules may be positioned between nanoelectrodes and the influence of the nanoelectrode atomic structure is lacking. Such knowledge may be desirable for the design practical molecular electronic devices.

Exemplary embodiments of the present invention may enable new experimental approaches that can advance the study of single molecule physics. The study of molecular tunnel junctions provides an opportunity to integrate traditional microelectronics reaction engineering concepts with molecular electronics and charge transport physics. This integration may lead to additional insights.

Figure 1:
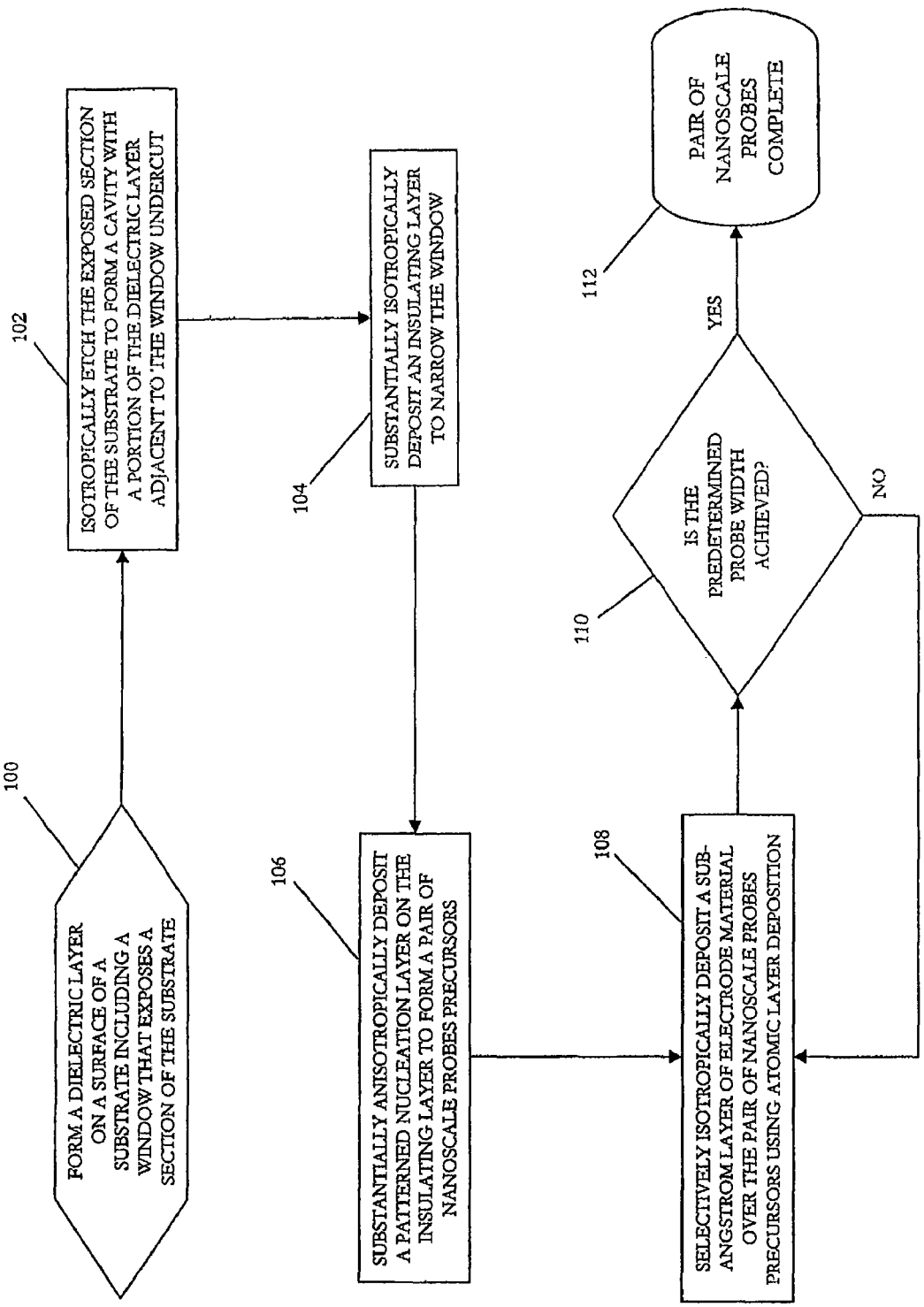
FIG. 1 is a flowchart illustrating an exemplary method for fabricating a monolithic pair of nanoscale probes according to the present invention.
Figure 2A:
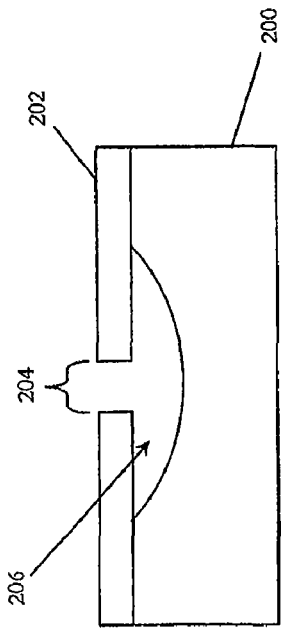
FIGS. 2A, 2B, 2C, and 2D are side cut-away drawings illustrating exemplary partially fabricated monolithic nanoscale probes during fabrication using the exemplary method of FIG. 1.
Figure 2B:
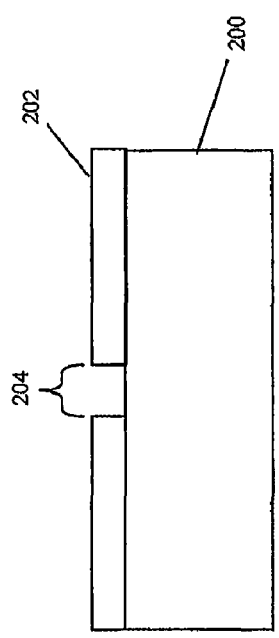
Figure 2C:
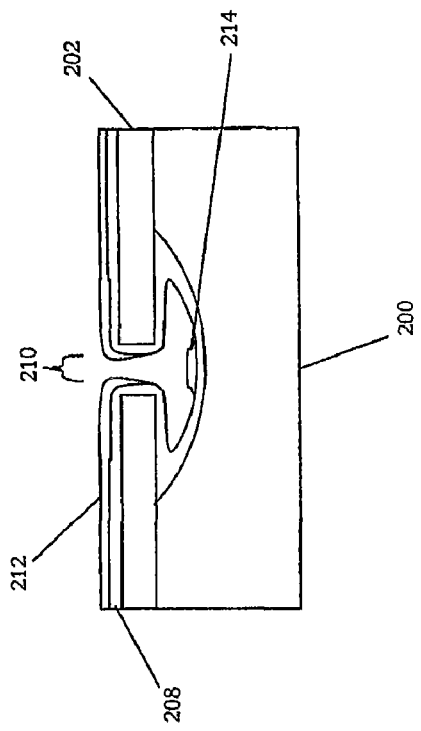
Figure 2D:
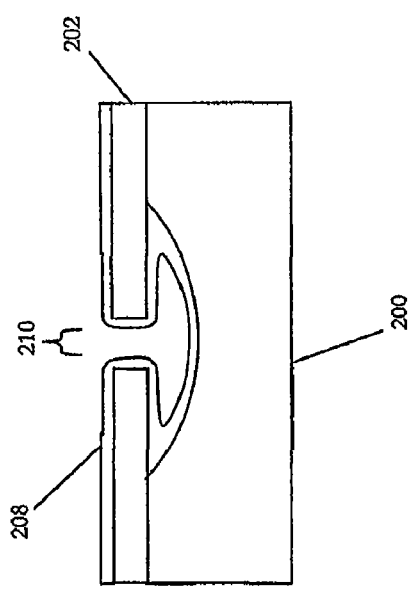
Figure 2E:
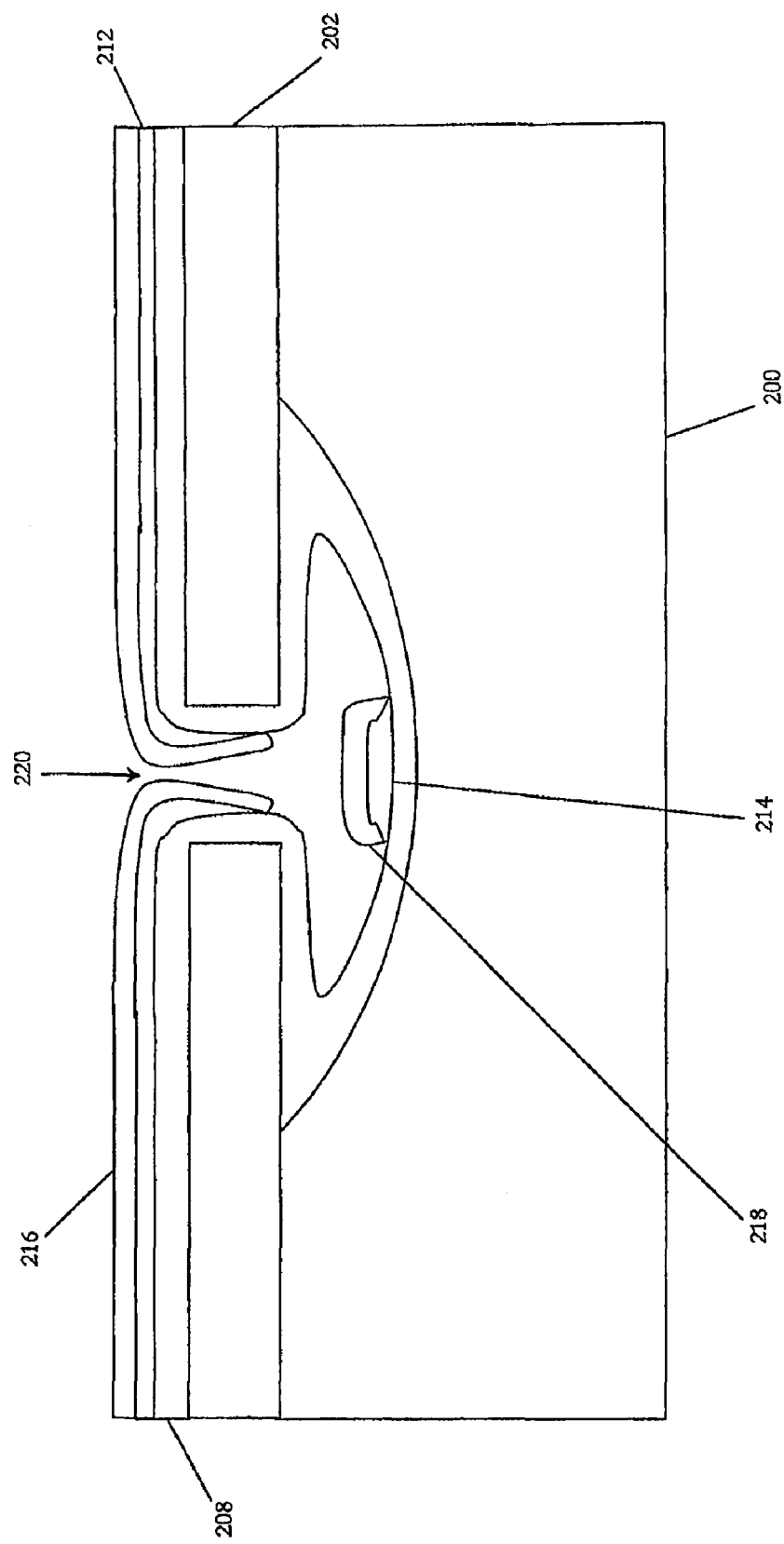
FIG. 2E is a side cut-away drawing illustrating an exemplary monolithic pair of nanoscale probes according to the present invention.

FIG. 1 illustrates an exemplary method for fabricating a monolithic pair of nanoscale probes according to the present invention, such as the exemplary probes depicted in FIG. 2E. Dielectric layer 202 is formed on the surface of substrate 200, step 100. Dielectric layer 202 includes window 204 which extends through dielectric layer 202 and exposes a section of the surface of substrate 200. FIG. 2A illustrates the partially fabricated monolithic pair of nanoscale probes at this step in the exemplary method of FIG. 1.

Dielectric layer 202 is formed of a dielectric material and substrate 200 is formed of a different material, which may or may not be a dielectric material. In an exemplary embodiment, substrate 200 may be formed of a semiconductive material and dielectric layer 202 may be formed of an oxide of the semiconductive material. This oxide layer may be deposited, or it may be grown as a thermal oxide on the surface of the semiconductor. For example, in an experimental demonstration of the exemplary method of FIG. 1, a 500 nm thick $SiO_2$ thermal oxide layer was grown on an Si substrate and then a window was etched though the thermal oxide layer.

The width of window 204 in dielectric layer 202 may be less than about 2 microns, and in certain embodiments may be about 100 nm. Window 204 may have a pair of concave edge portions that are closer than other portions of the edge(s) of window 204. These concave edge portions correspond to the pair of nanoscale probe precursors. If window 204 includes concave edge portions, then the width of the window may be defined to be the minimum distance between the opposing concave edge portions. Thus, the concave edge portions may be squared off, curved, or pointed. FIG. 3A illustrates exemplary monolithic pairs of nanoscale probes 300 that have been formed using windows that included concave edge portions.

Due to the window dimensions, enhanced photolithographic techniques may be used to define the location where the window is to be formed. Window 204 may then be anisotropically etched in the dielectric material at the defined location until the desired section of the surface of substrate is exposed.

Alternatively, the section of the surface of substrate 200 corresponding to window 204 may be masked with a resist layer before the dielectric layer is deposited. Dielectric layer 202 then may be deposited on the unmasked section(s) of the surface of substrate 200 and the resist may be removed to expose the section of the surface of substrate 200 corresponding to window 204.

One skilled in the art will understand that multiple pairs of nanoscale probes may be fabricated simultaneously using the exemplary method of FIG. 1. For example, simultaneous fabrication may involve the formation of multiple windows through the dielectric layer, windows that include multiple pairs of concave edge portions (as used to form the exemplary monolithic pairs of nanoscale probes 300 illustrated in FIG. 3A), and/or the patterning of the nucleation layer to include multiple pairs of nanoscale probe precursors in step 106. The exemplary method of claim 1, however, is described herein in terms of the fabrication of only one pair of nanoscale probes. This simplification is merely for illustrative purposes and is not intended to be limiting.

Although the monolithic pair of nanoscale probes are shown as formed from a substrate layer and a dielectric layer, other layers are possible. For example, it is contemplated that multiple layers of substrate material and/or dielectric may be used. It is also contemplated that electrical characteristics of the pairs of nanoscale probes may be adjusted by providing a series of dielectric layers. For example, each dielectric layer may have the same or a different depth and each dielectric layer made be formed from a respectively different dielectric material. It is further contemplated that the nanoscale probes may be formed by, for example, a pair of projections, each projection having a lower portion partially removed at least in a region between the projections. For example, each projection maybe a mushroom shape or an inverted "L" shape. It is possible for each projection to be formed of any number of materials as long as the lower portion of the projections are capable of being partially removed.

The exposed section of substrate 200 may be etched through window 204 using an isotropic etching technique that selectively etches the material of substrate 200, but does not substantially etch the dielectric material of dielectric layer 202, step 102. Thus, substrate 200 may be etched to form cavity 206, as shown in FIG. 2B. Cavity 206 may be shaped such that a portion of dielectric layer 202 adjacent to window 204 may be undercut by this isotropic etching step. The undercut portion of dielectric layer 202 that is adjacent to window 204 may extend 10 nm or more.

Substrate 200 may be etched using any isotropic etching technique, such as wet etching techniques, that has the desired material selectivity; however, reactive ion etching may be used to etch the exposed section of substrate 200 though window 204 and form cavity 206 due to the combination of selectivity and control possible in reactive ion etching. It is also noted that reactive ion etching may be performed in the same vacuum processing system as other steps of this exemplary method, thereby reducing handling of the workpiece. If reactive ion etching is used, the ions may be selected to react with the material of substrate 200 and to not substantially react with the dielectric material of dielectric layer 202.

Insulating layer 208 may be substantially isotropically deposited (e.g. conformally grown) on dielectric layer 202 and the etched surface of the cavity in substrate 200, step 104, as shown in FIG. 2C. This insulating layer may serve to electrically isolate the nanoscale probes as well as to narrow window 204 to gap 210, which may have a width of less than about 1 micron, and in certain embodiments between about 1 nm and about 10 nm. As described above with respect to window 204, the width of gap 210 may be measured as the shortest distance between the edges of this opening. In exemplary embodiments in which insulating layer 208 is a substantially conformal layer, if window 204 is formed with concave edge portions, then gap 210 also has concave edge portions that correspond to the nanoscale probe precursors. One skilled in the art understands that if advanced photolithographic techniques are used in step 100 to form window 204 with the desired submicron width of gap 210, it may be possible to omit step 104 and, thus, insulating layer 208. In these alternative embodiments, it is noted that the substrate material and the dielectric material of substrate 200 and dielectric layer 202 may be selected to achieve adequate electrical isolation between the nanoscale probes.

Insulating layer 208 may be any insulating material that may be formed on both the material of substrate 200 and the dielectric material of dielectric layer 202; however, if the dielectric material of dielectric layer 202 is an insulator, insulating layer 208 may be formed of the same dielectric material as dielectric layer 202.

As shown in FIG. 2D, nucleation layer 212 may be substantially anisotropically deposited on a top surface of insulating layer 208, step 106. A number of anisotropic deposition techniques, such as sputter or evaporation, may be used. It is noted that small deposit 214 may be unintentionally formed at the bottom of the remaining cavity as well. As long as small deposit 214 is not large enough to short out the nanoscale probes, it may be left in place. Nucleation layer 212 may be formed of a material that adheres to insulating layer 208 and may serve as a nucleation site for the electrode material of the nanoscale probes. For example, a nonconformal Ti/Pd nucleation layer may be used with an $SiO_2$ insulation layer and Cu electrode material.

Nucleation layer 212 may be patterned to form a pair of nanoscale probe precursors. This pair of nanoscale probe precursors may include a pair of edges that face each other across the width of gap 210 that correspond to tips of the pair of nanoscale probes.

The nucleation layer may be patterned so that the pair of nanoscale probe precursors may be electrically isolated and so that the pair of edges that face each other across the width of gap 210 represent the nearest proximity of the pair of nanoscale probe precursors to each other. If window 204 through dielectric layer 202 is formed in step 100 to have a pair of concave edge portions, then this pair of concave edge portions corresponds to the pair of nanoscale probe precursors and may simplify the patterning of nucleation layer 212. This patterning of the nucleation layer may be performed by masking the top surface of insulating layer 208 such that the exposed portions of the top surface correspond to the pair of nanoscale probe precursors. Nucleation layer 212 may then be substantially anisotropically deposited on the exposed portions of the top surface of insulating layer 208 to form the pair of nanoscale probe precursors. FIG. 3A illustrates an exemplary embodiment in which the nucleation layer is patterned to form three monolithic pairs of nanoscale probes 300 across trench 302 (e.g., the narrowed window).

Figure 3B:
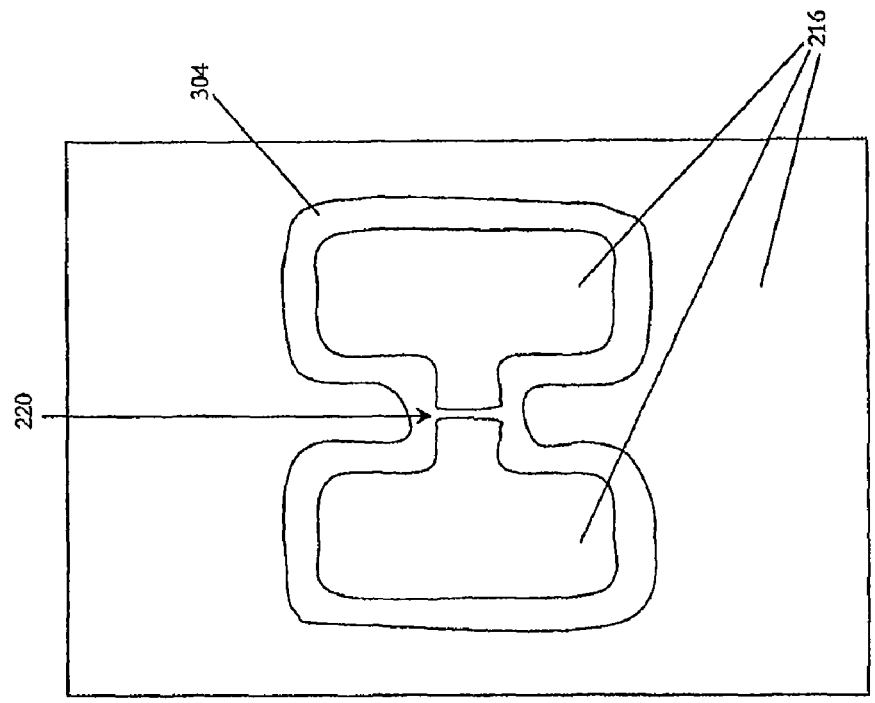
FIG. 3B is a top plan drawing illustrating another exemplary configuration of the exemplary monolithic pair of nanoscale probes of FIG. 2E.
Figure 3A:
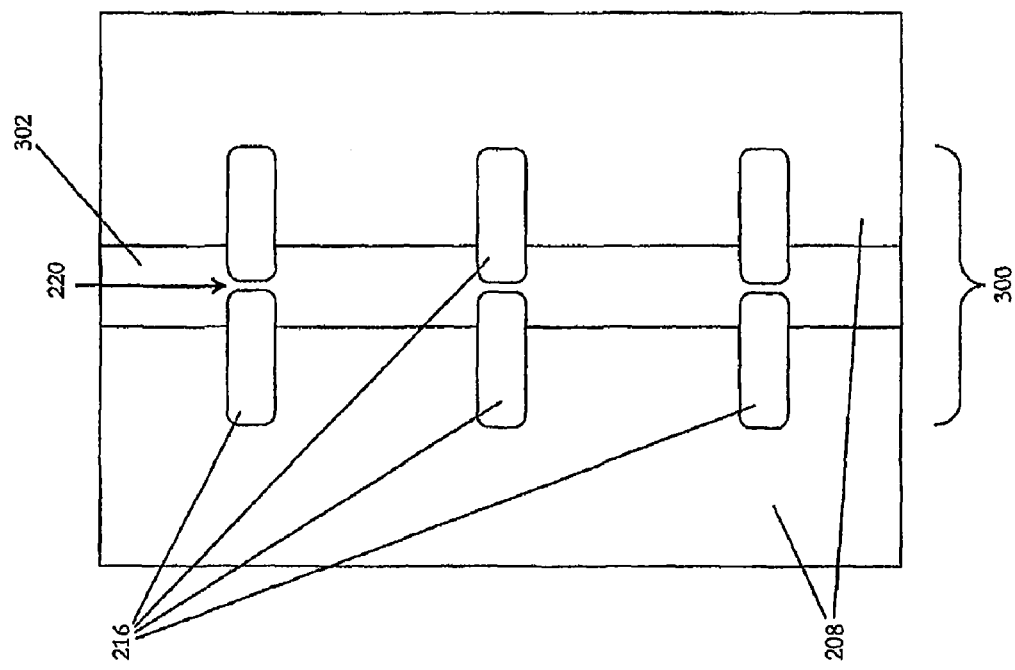
FIG. 3A is a top plan drawing illustrating an exemplary configuration of the exemplary monolithic pair of nanoscale probes of FIG. 2E.

Alternatively, the window region 210 may completely surround the electrodes to form moat 304 as shown in the exemplary embodiment of FIG. 3B. Moat 304 may have a separation larger than the nearest proximity of the pair nanoscale probe precursors. In this exemplary embodiment, no additional patterning of the nucleation layer occurs.

Atomic layer deposition (ALD) then may be used to selectively isotropically deposit a sub-monolayer layer of electrode material over the pair of nanoscale probe precursors (or probe projections), step 108. The electrode material may include at least one transition metal or metallic layer, such as Cu, Al, Au, Ag, Pt, Ti, Ni, Ru, Pd, Sn, In, Pb or W.

This isotropic deposition step may include depositing a sub-monolayer of electrode material over the edges of the pair of nanoscale probe precursors, so that the electrode material may narrow a distance between the tips of the pair of nanoscale probes. ALD is a deposition technique that may allow highly controlled deposition of material layers. The average layer thickness grown in each ALD cycle is typically less the one angstrom, i.e., each layer may not entirely cover the preceding layer.

In the exemplary method of FIG. 1, the pair of nanoscale probe precursors may be exposed to a vapor of an electrode material precursor. The electrode material precursor is typically a metal-organic compound, such as a metal chelate. Deposition parameters, such as: partial pressure; carrier gas; temperature; exposure time; and electrode material precursor, may be selected such that the electrode material precursor may be selectively grown on the pair of nanoscale probe precursors, but not exposed surfaces of insulating layer 208.

Non-adsorbed electrode material precursor vapor may be purged from the deposition chamber, typically using a noble gas, such as Ar. The pair of nanoscale probe precursors may be exposed to another reactant to react the electrode material precursor that may be adsorbed on the pair of nanoscale probe precursors, thereby forming the sub-monolayer of electrode material. Electrode material precursor may not react on the exposed surface portions of insulating layer 208, either because the electrode material precursor may not adsorb on the exposed surface portions of insulating layer 208 or because electrode material precursor that is adsorbed on the exposed surface portions of insulating layer 208 may not effectively react with the reactant. Non-reacted reactant then may be purged.

For example, ALD may be carried out using bis(2,2,6,6-tetramethyl-3,5-heptanedionato)copper(II) as the electrode material precursor and $H_2$ as the reactant to deposit ALD copper films. The copper precursor may be a solid, which may be evaporated from a bubbler controlled to approximately 120° C. Ar may be used as the carrier gas. Ar may also be used as the purge gas and its flow may be controlled with a proportional-integral-derivative (PID) controller to maintain a chamber pressure of about 1 torr. The partial pressure of hydrogen may be regulated near 0.9 torr with a leak valve. The entire ALD chamber may be heated to about 110° C. to prevent precursor condensation on the walls. The sample temperature may be maintained at about 235±3° C., which is a selective growth window for Cu ALD, where growth may be observed only on palladium seeded regions and may not be on $SiO_2$ regions. A typical growth cycle may consist of a 20 sec precursor pulse, a 10 sec Ar purge, a 10 sec $H_2$ pulse, and another 10 sec Ar purge. The relatively long precursor pulses may help ensure reactant saturation in the nanoelectrode region.

Once the reactant has been purged, it may be determined whether the desired probe width has been achieved, step 110. It is noted that several sub-angstrom layers of electrode material may be deposited between successive probe width measurements. The number of layers deposited between measurements may be reduced as the probe width approaches the desired probe width.

If the distance between tips 216 of the nanoscale probes is narrowed to approximately the desired probe width 220, then the pair of nanoscale probes are complete, step 112, as shown in FIG. 2E. Otherwise, additional sub-monolayers of electrode material may be added one at a time by repeating the ALD, step 108, until desired probe width 220 is achieved. The desired probe width is typically less than about 20 nm, and may be between 1 nm and 10 nm depending on the molecule to be analyzed. It is noted that it may be possible to grow exemplary monolithic pairs of nanoscale probes with probe widths of less than about 0.1 nm (approximately the diameter of an atom).

One exemplary method that may be used to determine whether desired probe width 220 is achieved may be to electrically couple the pair of nanoscale probe precursors to a voltage source and to measure the tunneling current between the pair of nanoscale probes after each ALD step. The distance between tips 216 of the nanoscale probes may then be determined based on the measured tunneling current. It is noted that the desired probe width may be measured in terms of the tunneling current rather than in distance units.

The precisely controllable, selective growth of ALD is a feature of the exemplary process of FIG. 1. The ability of ALD to allow selective isotropic deposition enables electrical isolation between the pair of nanoscale probes to be maintained throughout their growth. Also, because each ALD cycle may deposit less than an atomic thickness of material, certain exemplary embodiments have the potential to allow extremely precise control of the probe width, allowing the tailoring of nanoscale probe tips for specific molecules.

The precisely controllable ALD growth may be combined with periodic or continuous monitoring through the electrical circuit connecting the electrode pairs such that the growth process may be automated to terminate when the desired probe width or other properties, such as measured capacitance, measured electrostatic field strength and/or a measured tunneling current, have been achieved. The automation may include supervised or unsupervised cycling between electrical measurements and ALD growth cycles, for example.

FIG. 2E illustrates an exemplary monolithic pair of nanoscale probes according to the present invention. As may be seen in this drawing, the exemplary monolithic pair of nanoscale probes include: substrate 200, which may have a cavity that extends from a surface of the substrate into a body of the substrate; dielectric layer 202 that may include a window that extends to the cavity of substrate 200; insulating layer 208 may be formed on dielectric layer 202 and the surface of the cavity in substrate 200; nanoscale probe precursors 212 may be formed on the top surface of insulating layer 208; and a plurality of sub-monolayers of electrode material selectively atomic layer may be deposited over the pair of nanoscale probe precursors to form probe tips 216.

Exemplary devices according to the present invention may include chemical modification of the probes to enhance interactions between the probes and targeted agents, which may include molecules or nanoparticles. Such modifications may include the adsorption of self assembled monolayers that couple, for example attach strongly, to the probe surfaces. The modification of the probes with monolayers of organic molecules or other metals may enhance the ability to tailor the nanoelectrodes for sensor applications. Molecular recognition may be enhanced by the immobilization of molecules in the region between the nanoscale probes. The chemical functionalization of the probe surfaces may impart improved selectivity to the probes for the adsorption of targeted agents. For example, copper nanoscale probes may be treated with self assembled monolayers to inhibit oxidation. Other improvement using chemical modification would be understood by one of ordinary skill in the art from the description herein.

The exemplary monolithic pair of nanoscale probes illustrated in FIG. 2E also may include small deposits 214 (of nucleation layer material) and 218 (of electrode material). These small deposits may be unintentionally formed during fabrication. It is contemplated that these small deposits may be removed; however, they may not affect operation of the exemplary monolithic pair of nanoscale probes and, thus, may be left in place.

Figure 4:
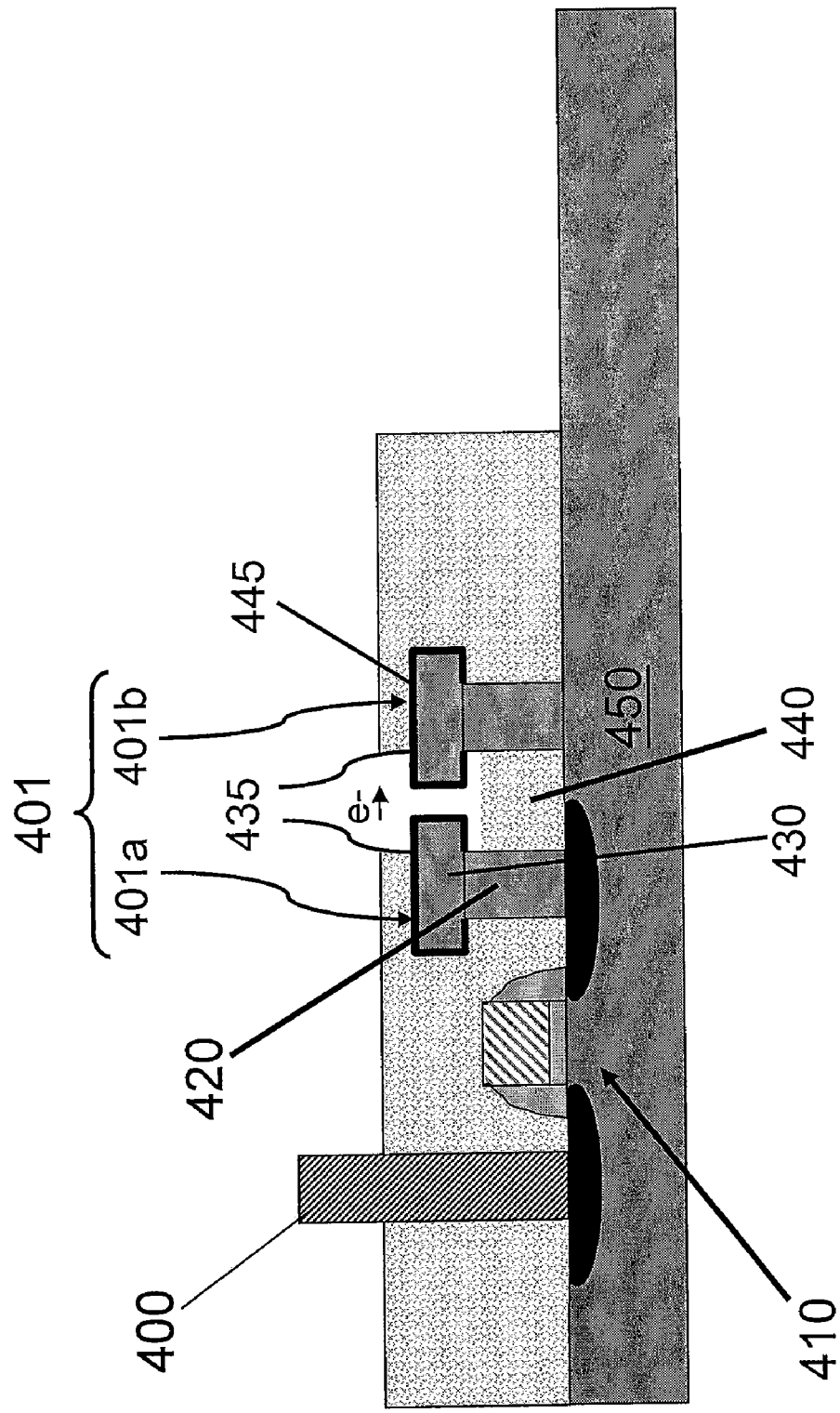
FIG. 4 is a side cut-away drawing illustrating a pair of nanoscale probes according to another exemplary embodiment of the present invention.

FIG. 4 is a side cut-away drawing illustrating a pair of nanoscale probes 401a and 401b according to another exemplary embodiment of the present invention.

In FIG. 4, a contact 400 and a transistor 410 are provided for external electrical connection to the pair of nanoscale probes 401. Each nanoscale probe 401 may be formed on a substrate 450 and includes a plug 420 and a second material 430 formed on the plug 420, the plug 420 and second material 430 partially surrounded by a first material 440. Transistor 410 may be electrically coupled between contact 400 and the plug 420 of one of the nanoscale probes (e.g., probe 401a) to selectively, electrically isolate that probe from an external electrical connection. The second material 430 may be formed on the surface of each plug 420 and may have a cavity (opening) extending through second material 430 into first material 440 and undercutting second material 430 to form a pair of nanoscale projections 435 having surfaces facing each other. One or more sub-monolayers 445 are formed over the pair of nanoscale projections 435 to form a pair of nanoscale probes such that a distance between facing surfaces of the pair of nanoscale probes is approximately equal to a predetermined probe separation between about 0.1 nm and about 20 nm. Further, the nanoscale probes may be either electrically isolated from each other or electrically coupled by a tunneling current. In certain exemplary embodiments, plug 420 and second material 430 of the pair of nanoscale probes may form adjacent projections and first material 440 around a periphery of each of the adjacent projections may be partially removed to form the pair of nanoscale projections 435. Alternatively, only first material 440 between the nanoscale probes may be partially removed to form the pair of nanoscale projections 435. Second material 430 420 may be the same or a different material. Second material 430 may be patterned to provide the nanoscale projections 435.

Figure 5:
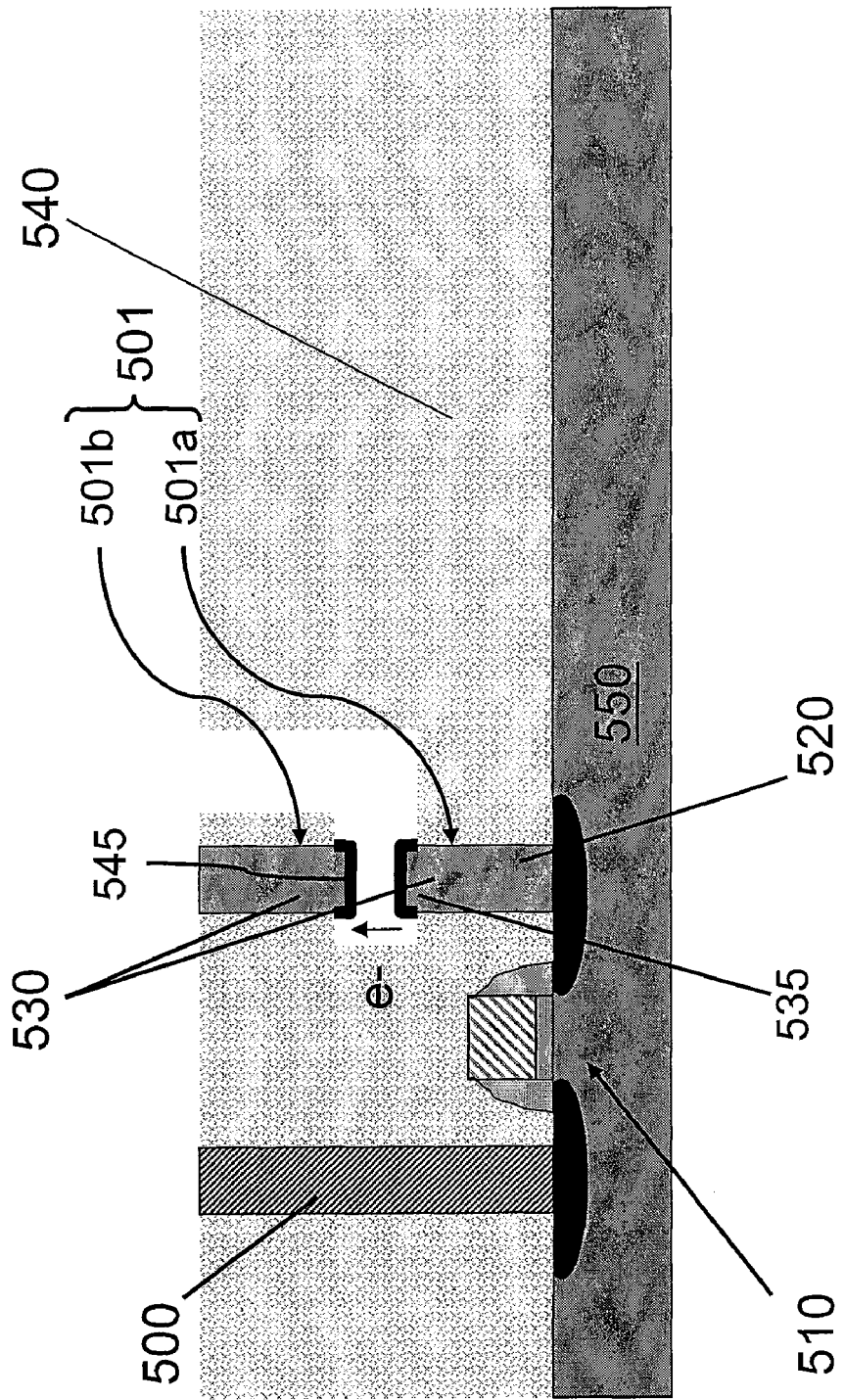
FIG. 5 is a side cut-away drawing illustrating a pair of nanoscale probes according to a further exemplary embodiment of the present invention.

FIG. 5 is a side cut-away drawing illustrating a pair of nanoscale probes 501a and 501b according to a further exemplary embodiment of the present invention.

In FIG. 5 a contact 500 and a transistor 510 are provided for external electrical connection to the pair of nanoscale probes 501. Each nanoscale probe 501 includes a plug 520 and a second material 530 formed on the plug 520, the plug and second material 530 partially surrounded by a first material 540 Transistor 510 may be electrically coupled between contact 500 and the plug 520 of one of the nanoscale probes (e.g., probe 501a) to selectively, electrically isolate that nanoscale probe 501 from an external electrical connection. A cavity (opening) in first material 540 may extend though second material 530 at least between a pair of nanoscale probe projections 535 to form the pair of nanoscale projections 535 having surfaces facing each other. The pair of nanoscale projections 535 may be formed by partially removing first material 540 adjacent to each plug 520. One or more sub-monolayers 545 are formed over the pair of nanoscale projections 535 to form the pair of nanoscale probes 501 such that a distance between facing surfaces of the pair of nanoscale probes is approximately equal to a predetermined probe separation between about 0.1 nm and about 20 nm. Further, the nanoscale probes 501 may be either electrically isolated from each other or electrically coupled by a tunneling current. In certain exemplary embodiments, plug 520 and second material 530 of the pair of nanoscale probes may form adjacent projections and first material 540 around a periphery of each of the adjacent projections may be partially removed to form the pair of nanoscale projections 535. Alternatively, only first material 540 between the nanoscale probes 501 may be partially removed to form the pair of nanoscale projections 535. Second material 530 and plugs 520 may be the same or a different material. Second material 440 may be patterned to provide the nanoscale projections 535.

One of ordinary skill understands from the description herein how to fabricate the nanoscale probes 401 and 501. One of ordinary skill also understands from the description herein that circuitry may be provided to couple to the nanoscale probes for generating a tunneling current between the pair of nanoscale probes.

Exemplary devices according to the present invention may be used to measure the electrical properties of single or very small numbers of molecules trapped in a nanojunction. The use of advanced reaction engineering principles including ALD and selective area growth allow for the fabrication of molecular junctions with tunable spacing. The precise growth control (~0.05 nm/cycle), for example, possible in ALD allows fabrication of electrodes spaced in the range of about 1 nm to 10 nm. The monolithic design used in exemplary embodiments may reduce issues relating to vibration and/or thermal expansion of electrodes. For example, in certain exemplary embodiments, the electrode spacing may reduce by less than 0.1 nm when the electrodes cool from 200° C. to room temperature.

Successful nanofabrication of monolithic metal-vacuum-metal tunnel junctions has been achieved by the Inventors with demonstrated nanojunctions of 1-2 nm. Field emission and metal-vacuum-metal tunneling electrical measurements have been used to characterize the electrode properties and electrode spacing in-situ during the ALD growth. The in-situ electrical measurement shows two growth regimes. Initially, the field emission data show a linear drop in voltage as a function of growth cycles for a fixed current. After many cycles, a saturation regime is encountered where the voltage saturates for a fixed precursor cycle time. The self saturation reflects the precursor (~1.5 nm in size) transport limited regimes in nanojunctions. The self saturation may be useful for fabricating parallel arrays of probe pairs. The data was modeled using Teague's code (E. C. Teague, Journal of Research of the National Bureau of Standards 1986, 91(4), 171) for tunnel junctions, which gives a good fit to the experiment with barrier height of 4.5 eV, spacing of 1 nm and tip radius from 1-100 nm. These tunnel junctions have been found to be stable in vacuum as well as in air for at least one week.

In certain exemplary embodiments a monolithic pair of nanoscale electrodes are formed by selective atomic layer deposition over the pair of nanoscale probes so that the distance between the tips of the pair of nanoscale probes is approximately equal to a predetermined probe separation between about 0.1 nm and 20 nm and the probes are electrically isolated.

The present invention includes a number of exemplary embodiments of devices and methods. Although the invention is illustrated and described herein with reference to specific embodiments, it is not intended to be limited to the details shown. Rather, various modifications may be made in the details within the scope and range of equivalents of the claims and without departing from the invention.

What is claimed:

1. A monolithic pair of nanoscale probes, comprising:
   a first material;
   a second material formed on the surface of the first material and having a cavity extending through the second material into the first material and undercutting the second material;
   a pair of nanoscale projections formed from the second material and having surfaces facing each other; and
   a pair of nanoscale electrodes formed by a plurality of sub-monolayers of electrode material formed over the pair of nanoscale projections, a distance between facing surfaces of the pair of nanoscale electrodes being approximately equal to a predetermined probe separation between about 0.1 nm and about 20 nm.

2. The monolithic pair of nanoscale probes according to claim 1, wherein:
   the first and second materials of the pair of nanoscale probes form adjacent projections and the first material around a periphery of each of the nanoscale probes is removed to form the pair of nanoscale projections.

3. The monolithic pair of nanoscale probes according to claim 1, wherein:
   the first and second materials of the pair of nanoscale probes form adjacent projections and the first material between the nanoscale probes is removed to form the pair of nanoscale projections.

4. A monolithic pair of nanoscale probes, comprising:
a substrate formed of a substrate material, the substrate having a cavity that extends from a surface of the substrate into a body of the substrate;
a dielectric layer formed on the surface of the substrate of a dielectric material, the dielectric layer including a window that extends through the dielectric layer to the cavity of the substrate such that a portion of the dielectric layer adjacent to the window extends over the cavity;
a pair of nanoscale probe precursors formed over the dielectric layer, the pair of nanoscale probe precursors including a pair of edges facing each other across the window, the pair of edges of the pair of nanoscale probe precursors correspond to tips of the pair of nanoscale probes; and
a plurality of sub-monolayers of electrode material selectively atomic layer deposited over the pair of nanoscale probe precursors, including the pair of edges, so that a distance between the tips of the pair of nanoscale probes is approximately equal to a predetermined probe width between about 0.1 nm and about 20 nm.

5. A monolithic pair of nanoscale probes according to claim 4, wherein the substrate material is Si and the dielectric material is $SiO_2$.

6. A monolithic pair of nanoscale probes according to claim 4, wherein the substrate material is a semiconductor material.

7. A monolithic pair of nanoscale probes according to claim 6, wherein the dielectric material is a thermal oxide of the semiconductor material.

8. A monolithic pair of nanoscale probes according to claim 4, wherein a distance between edges of the window in the dielectric layer is less than about 2 microns.

9. A monolithic pair of nanoscale probes according to claim 4, wherein a thickness of the dielectric layer is about 500 nm.

10. A monolithic pair of nanoscale probes according to claim 4, wherein the portion of the dielectric layer adjacent to the window extends over the cavity farther than about 500 nm.

11. A monolithic pair of nanoscale probes according to claim 4, wherein:
the window through the dielectric layer has a pair of concave edge portions, the pair of concave edge portions corresponding to the pair of nanoscale probe precursors; and
the tips of the pair of nanoscale probes correspond to the pair of concave edge portions of the window.

12. A monolithic pair of nanoscale probes according to claim 4, wherein the pair of nanoscale probe precursors include a nonconformal Ti/Pd nucleation layer.

13. A monolithic pair of nanoscale probes according to claim 4, wherein the plurality of sub-monolayers are sub-angstrom layers of electrode material and include at least one of Cu, Al, Au, Ag, Pt, Ti, In, Ni, Ru, Pd, Sn, Pb or W.

14. A monolithic pair of nanoscale probes according to claim 4, wherein the predetermined probe width is between about 1 nm about 10 nm.

15. A monolithic pair of nanoscale probes according to claim 4, further comprising an insulating layer formed between the dielectric layer and the pair of nanoscale probe precursors, the insulating layer formed on edges of the window in the dielectric layer leaving a gap of less than 1 micron.

16. A monolithic pair of nanoscale probes according to claim 15, wherein the insulating layer is formed of the dielectric material.

17. A monolithic pair of nanoscale probes according to claim 15, wherein the gap in the insulating layer formed on edges of the window in the dielectric layer is between about 5 nm and about 10 nm.

18. A monolithic pair of nanoscale probes, comprising:
a pair of nanoscale probe projections corresponding to tips of the monolithic pair of nanoscale probes; and
a plurality of sub-monolayers of electrode material selectively atomic layer deposited over the pair of nanoscale probe projections to form the monolithic pair of nanoscale probes so that a distance between the monolithic pair of nanoscale probes is approximately equal to a predetermined probe separation between about 0.1 nm and about 20 nm.

* * * * *